United States Patent [19]

Shimura

[11] Patent Number: 5,063,167
[45] Date of Patent: Nov. 5, 1991

[54] METHOD OF PRODUCING A BIPOLAR TRANSISTOR WITH SPACERS

[75] Inventor: Teruyuki Shimura, Itami, Japan

[73] Assignee: Mitsubishi Denki Kabushiki Kaisha, Japan

[21] Appl. No.: 573,698

[22] Filed: Aug. 28, 1990

Related U.S. Application Data

[62] Division of Ser. No. 217,292, Jul. 11, 1988, Pat. No. 4,967,254.

[30] Foreign Application Priority Data

Jul. 16, 1987 [JP] Japan .................................. 62-179343
Jul. 16, 1987 [JP] Japan .................................. 62-179344

[51] Int. Cl.$^5$ .......................................... H01L 21/331
[52] U.S. Cl. ...................................... 437/31; 437/228; 437/947; 437/133; 748/DIG. 111
[58] Field of Search .................... 437/31, 32, 33, 133, 437/228, 229, 238, 944, 947, 978; 748/DIG. 11, DIG. 72, DIG. 111

[56] References Cited

U.S. PATENT DOCUMENTS

| 4,315,271 | 2/1982 | Roger .................................... 357/20 |
| 4,573,256 | 3/1986 | Lechaton et al. ...................... 437/31 |
| 4,825,265 | 4/1989 | Lunardi et al. ........................ 357/16 |
| 4,872,040 | 10/1989 | Jackson ................................. 357/16 |
| 4,889,821 | 12/1989 | Selle et al. ............................. 437/31 |
| 4,904,612 | 2/1990 | Zwicknagl et al. .................... 437/31 |
| 4,910,170 | 3/1990 | Motozima et al. ................... 437/228 |
| 4,927,774 | 5/1990 | Welbourn et al. ..................... 437/31 |

FOREIGN PATENT DOCUMENTS

| 0300803 | 1/1989 | European Pat. Off. . |
| 61-102774 | 5/1986 | Japan . |
| 61-137364 | 6/1986 | Japan . |
| 63-53971 | 3/1988 | Japan . |
| 63-177464 | 7/1988 | Japan . |

OTHER PUBLICATIONS

Morizuka et al., "Self-Aligned AlGaAs/GaAs... Double Implantation", 18th Conference on Solid State Devices and Materials, 1986, pp. 359-362.

Primary Examiner—Brian E. Hearn
Assistant Examiner—T. N. Quach
Attorney, Agent, or Firm—Leydig, Voit & Mayer

[57] ABSTRACT

A method of producing a semiconductor device includes providing a collector layer comprising a first conductivity type semiconductor layer, a base layer comprising a second conductivity type semiconductor layer produced on the collector layer, an emitter layer comprising a first conductivity type semiconductor layer produced on the base layer, a contact layer comprising an undoped semiconductor layer produced on the emitter layer, second conductivity type first implantation regions produced at regions each consisting of the contact layer, the emitter layer, and the base layer, so as to leave a central region therebetween, base electrodes produced on the first implantation regions, a first conductivity type second implantation region produced by implanting impurities from the surface of the contact layer extending into the emitter layer, in a region between the first implantation regions, and an emitter electrode produced on the second implantation region. Also, a method of producing a semiconductor device includes providing an emitter layer comprising undoped semiconductor layer and a first conductivity type second implantation region produced by implanting impurities from the surface of the undoped semiconductor layer extending into the base layer, at a region between the first implantation regions.

6 Claims, 4 Drawing Sheets

METHOD OF PRODUCING A BIPOLAR TRANSISTOR WITH SPACERS

This application is a division of application Ser. No. 07/217,292, filed July 11, 1988, now U.S. Pat. No. 4,967,254.

FIELD OF THE INVENTION

The present invention relates to semiconductor device and method for the production thereof, and more particularly to transistors having a reduced emitter size.

BACKGROUND OF THE INVENTION

FIG. 5 is a cross-sectional view of a prior art HBT (Hetero-Bipolar Transistor) utilizing a self alignment structure and a dummy emitter.

In FIG. 5, reference numeral 26 designates a sub-collector layer comprising n+ type GaAs. A collector layer 25 comprising n− type GaAs is provided on the sub-collector layer 26. A base layer 24 comprising p+ type GaAs is provided on the collector layer 25. An emitter layer 23 comprising AlGaAs is provided on the base layer 24. A cap layer 22 comprising n type GaAs is provided on the emitter layer 23. A contact layer 21 for ohmic contact with an emitter electrode, comprising n+ type GaAs is provided on the cap layer 22. Be+ implantation regions 30 are provided at surface regions of the base layer 24 and the n type emitter layer 23 for contacting base electrode 28 with the base layer 24. An emitter electrode 27 is provided on the central portion of the contact layer 21. Base electrodes 28 are provided on the Be+ implantation regions 30. SiO$_2$ films 29 are provided on the Be+ implantation regions 30 so as to insulate the base electrodes 28 and the emitter electrode 27.

The production process will be described.

First of all, collector layer 25, base layer 24, emitter layer 23, cap layer 22, and contact layer 21 are successively epitaxially grown on a sub-collector layer 26, and thereafter, an etching of the contact layer 21 and part of the cap layer 22 is conducted so as to enable contact of the base electrodes with the base region 24 which should be conducted later. Thereafter, ion implantation of Be+ is conducted using a dummy emitter as a mask thereby to produce Be+ implantation regions 30 which reach inside of the base layer 24 from the cap layer 22. Then, the cap layer 22 and the emitter layer 23 in the Be+ implantation regions 30 are inverted into p type. Next, a SiO$_2$ film is produced on the Be+ implantation regions 30, required portions of the SiO$_2$ film are removed, and emitter electrode 27 and base electrodes 28 are produced with the remaining SiO$_2$ films 29 as a mask.

In the prior art HBT produced in this way, the BE+ implantation regions 30 are produced self-alignigly and thus the base resistance is low, thereby resulting in a superior characteristics.

In the prior art HBT of such a construction, portions of the contact layer 21 and part of the cap layer 22 have to be removed by etching in producing the Be+ implantation regions 30. When wet etching is adopted, reduction in the emitter size cannot be realized due to side etchings and variations in etchings, that produces variations in the emitter size. In addition, homojunction capacitance arises between emitter and base, thereby reducing operating speed. Furthermore, it is impossible to produce a completely planar structure, resulting in a disadvantage in producing integrated circuits.

SUMMARY OF THE INVENTION

An object of the present invention is to provide semiconductor device and method for the production thereof capable of reducing the emitter size and base emitter homojunction capacitance, and that is advantageous in circuit integration.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to the present invention, a semiconductor device is produced so as to include a collector layer comprising a first conductivity type semiconductor layer, a base layer comprising a second conductivity type semiconductor layer produced on the collector layer, an emitter layer comprising a first conductivity type semiconductor layer produced on the base region, a contact layer comprising an undoped semiconductor layer produced on the emitter region, second conductivity type first implantation regions produced at regions each consisting of the undoped semiconductor layer, the emitter layer, and the base layer, so as to leave a central region that is not part of the first implanation regions base electrodes produced on the first implantation regions, a first conductivity type second implantation region produced by implanting impurities from the surface of the contact layer extending into the emitter layer, at a region between the first implantation regions. Or, a semiconductor device is produced so as to include an emitter layer comprising an undoped semiconductor layer and a first conductivity type second implantation region produced by implanting impurities from the surface of the undoped semiconductor layer extending into the base layer, at a region between the first implantation regions. Therefore, while the current flowing between the second implantation region and the collector region is controlled by the current injected from the base region, the junction capacitance between the base electrode and the emitter electrode is reduced by the undoped semiconductor layer existing between the first and the second implantation regions.

DETAILED DESCRIPTION OF THE PREFERRED EMBODIMENTS

An embodiment of the present invention will be described in detail with reference to the drawings.

Figure 1:
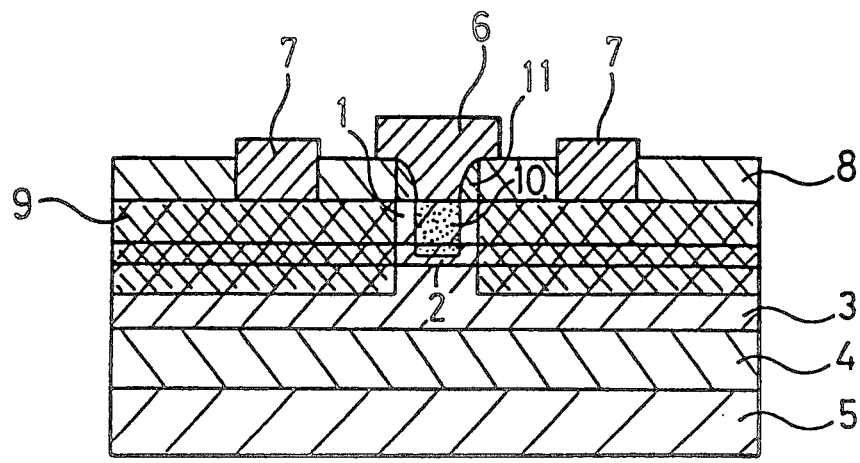
FIG. 1 is a cross-sectional view showing a structure of a semiconductor device according to the present invention.

FIG. 1 shows a structure of a semiconductor device according to the present invention. In FIG. 1, reference numeral 5 designates a sub-collector layer comprising n+ type GaAs having impurity concentration of $10^{18} \sim 5 \times 10^{19}/cm^3$. A collector layer 4 comprising n− type GaAs having impurity concentration of $10^{16} \sim 5 \times 10^{17}/cm^3$ is provided on the sub-collector layer 5. These layers 4 and 5 are semiconductor layers for constituting a collector region. A base layer 3 comprising p+ type GaAs having impurity concentration of $10^{19} \sim 10^{20}/cm^3$ as a semiconductor layer for constituting a base region is provided on the collector layer 4. An emitter layer 2 comprising n type AlGaAs having impurity concentration of $10^{17} \sim 10^{18}/cm^3$ as a semiconductor layer for constituting an emitter region is provided on the base layer 3. A contact layer 1 comprising undoped GaAs is provided on the emitter layer 2. Be+ implantation regions (first implantation region) 9 having impurity concentration of $5 \times 10^{18} \sim 5 \times 10^{19}/cm^3$ as base contact region for contacting the base electrode with the base region 3 are provided at surface regions of three layers of the contact layer 1, the emitter layer 2, and the base layer 3. Si+ implantation region (second implantation region) 10 having impurity concentration of $10^{18} \sim 10^{19}/cm^3$ as an emitter contact region for contacting the emitter electrode with the emitter region is provided at a central portion of the emitter layer 2, larger 2 is centrally disposed between the two BE+ implantation regions 9. SiO2 films 8 are provided on the contact layer 1. An emitter electrode 6 is provided on the Si+ implantation region 10 which is centrally disposed between the Be+ implantation regions. Base electrodes 7 are provided on the Be+ implantation regions 9. The reference numeral 11 designates side walls comprising Si3N4 film.

Figure 2A:
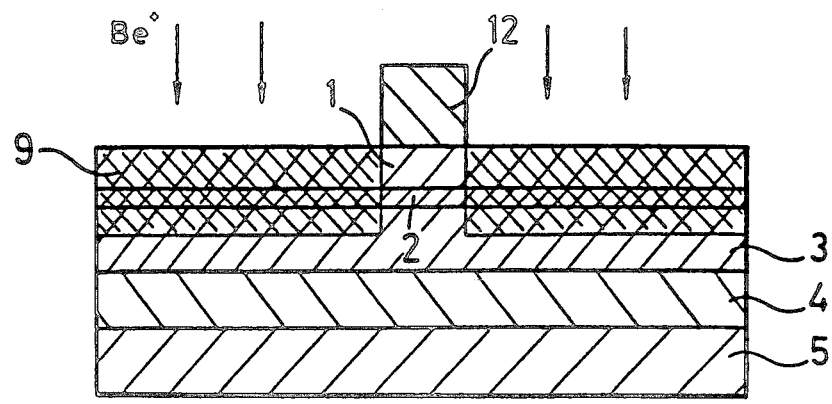
FIGS. 2(1)–2(c) are diagrams explaining a method of producing the semiconductor device of FIG. 1.
Figure 2B:
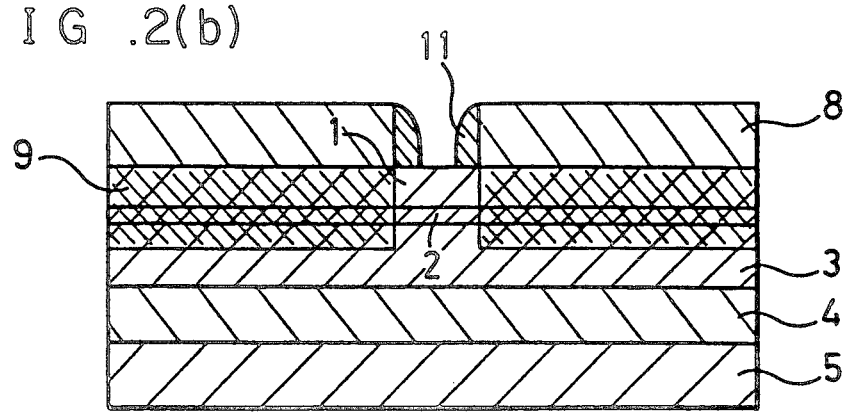
Figure 2C:
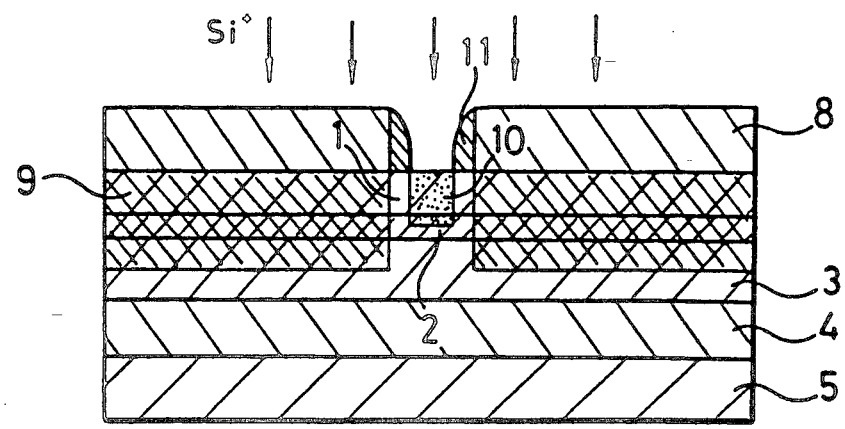

FIGS. 2(a)-2(c) are diagrams explaining a method of producing a semiconductor device of FIG. 1. In FIG. 2, the same reference numerals designate the same or corresponding elements as those shown in FIG. 1. Reference numeral 12 designates a resist pattern.

The production method of the device will be described.

First of all, the collector layer 4, the base layer 3, the emitter layer 2, and the contact layer 1 are successively grown on the sub-collector layer 5, and a resist pattern 12 is produced at a region on the contact layer 1 as a mask for producing the Be+ implantation regions 9. Thereafter, ion implantation of Be+ is conducted so as to surround a central region BE+ implantation regions 9 are produced so as to extend into the base region 3 from the surface of the contact layer 1 (FIG. 2(a)).

Next, SiO2 films 8 are produced on the BE+ regions 9 using the resist pattern 12 as a mask, and thereafter the resist pattern 12 is removed. Thereafter, a Si3N4 film is produced on the SiO2 films 8 and the contact layer 1 and a selective etching of the Si3N4 film is conducted thereby to leave side walls 11 of the Si3N4 film only at the internal walls of the SiO2 films 8 (FIG. 2(b)).

Next, ion implantation of Si+ is conducted using the SiO2 films 8 and the side walls 11 as a mask. The Si+ implantation region 10 is produced so as to extend into the emitter layer 2 from the surface of the contact layer 1, between and spaced from the Be+ implantation regions 9. The contact layer 1 inside the Si+ implantation region 10 becomes n+ type having impurity concentration of $10^{19} \sim 10^{19}/cm^3$ (FIG. 2(c)).

Besides, implantations of Be+ and Si+ are required to be conducted until the contact layer 1 contains such a concentration of departs that is contact resistance reduced.

Thereafter, by conducting thermal annealing at a temperature of 850° C. ~950° C. for several to several tens of seconds, the Be+ implantation region 9 and the Si+ implantation region 10 are activated at the same time. Thereafter, the emitter electrode 6 and the base electrode 7 are produced by a vapor plating lift-off method, to complete a structure of an HBT shown in FIG. 1.

Figure 3:
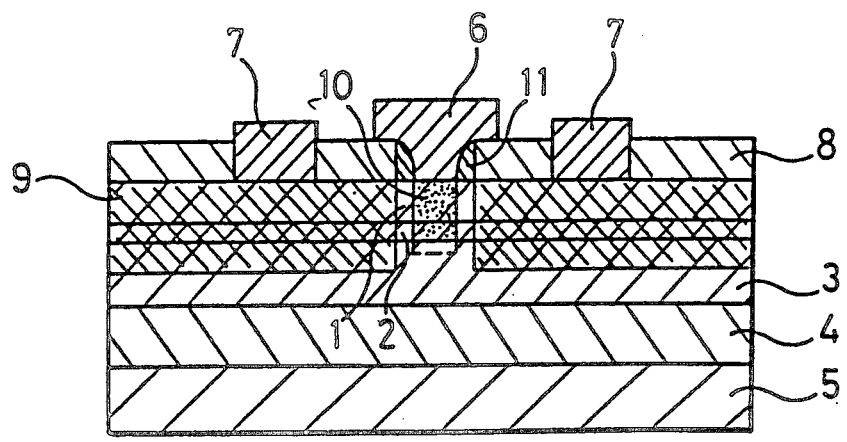
FIG. 3 is a cross-sectional view showing a structure of another semiconductor device according to the present invention.
Figure 4A:
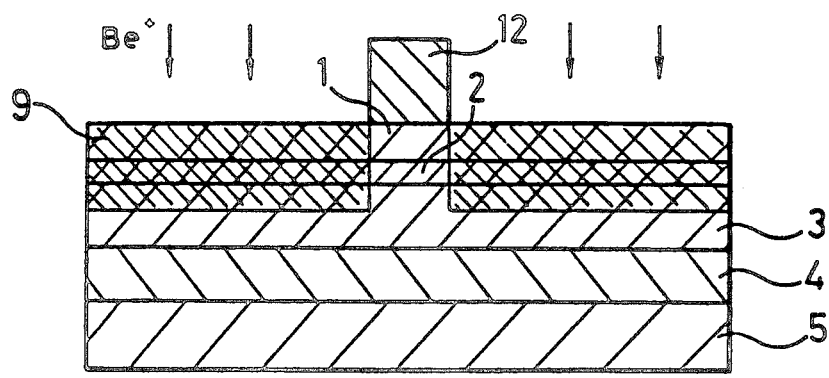
FIGS. 4(a)–4(c) are diagrams for explaining a method of producing the semiconductor device of FIG. 3.
Figure 4B:
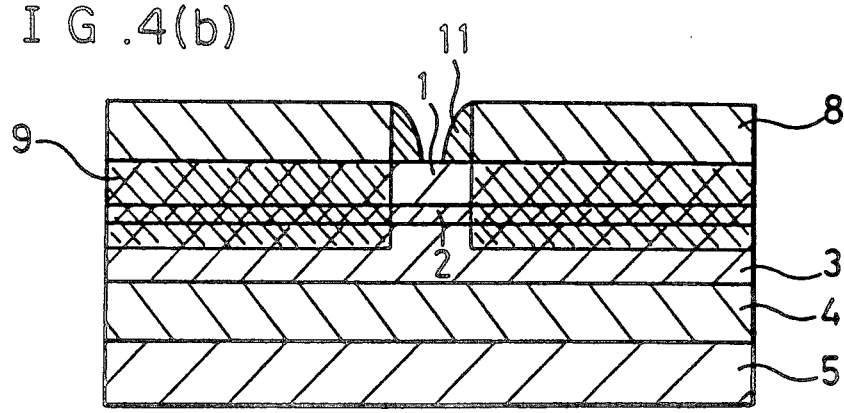
Figure 4C:
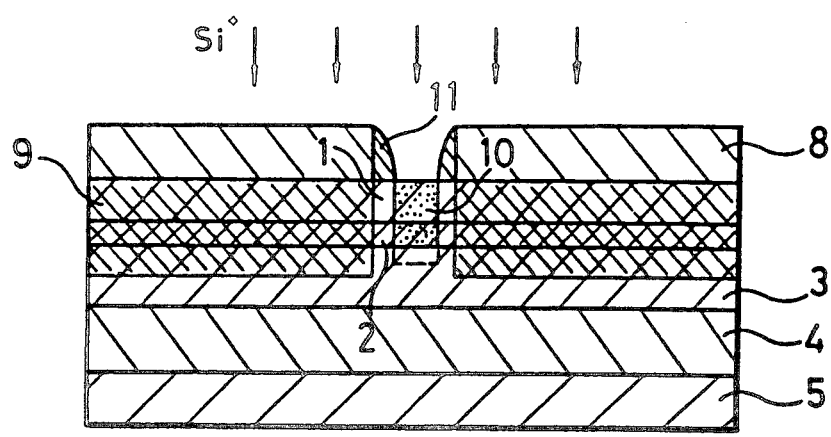
Figure 5:
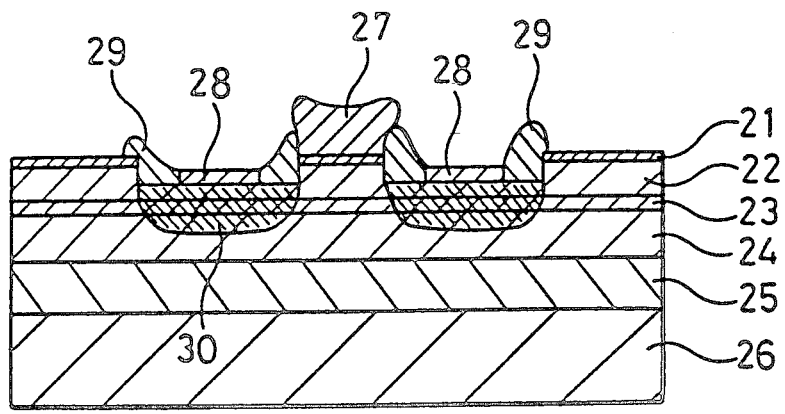
FIG. 5 is a cross-sectional view showing a prior art semiconductor device.

FIG. 3 shows another embodiment of a semiconductor device according to the present invention, and FIG. 4 shows production processes thereof.

This second embodiment is only different from the first embodiment in that the emitter layer 2 comprises undoped GaAs layer and that the implantation of Si+ ions is conducted so as to extend into the base layer 3 to convert the conductivity types of the contact layer 1 and the emitter layer 2 to n+ type and n type having impurity concentration of $10^{18} \sim 10^{19}/cm^3$ and $10^{17} 10^{18}/cm^3$, respectively. In this case, although Si+ ions reach inside of the base layer 3 passing through the emitter layer 2, the base layer 3 can remain p+ type because of its high p type depart concentration (FIG. 2(c)).

In the HBTs of the present invention, the emitter size can be regulated by the width of the Si+ implantation region 10 which is produced by ion implantation. An emitter size less than 0.5 μm can be achieved, while that of the prior art device is 1~2 μm. Furthermore, this HBT can be produced without an etching. Therefore, side etching and variations in the etching process do not present problems which have arisen in the prior art and reduction in the emitter size can be reliably. Furthermore, the homojunction capacitance between base and emitter can be reduced to ⅓ relative to the prior art method and therefore operational characteristics of the HBT, especially the high speed characteristics are enhanced. A planar structure can be realized and the roughness of the exposed surface is greatly reduced.

In the above illustrated embodiment, an HBT of a GaAs series III-V semiconductor compounds is described, but the present invention can be applied to other semiconductor material, such as InP series with the same effects as described above.

Furthermore, Si+ and Be+ are used in the described example, but other dopants can be used. That is, Se+ and S+ can be used in place of TM Si+, and Mg+, Zn+, and C+ in place of BE+.

As is evident from the foregoing description, according to the present invention, a semiconductor device is provided with a first conductivity type collector layer, a second conductivity type base layer produced on the collector region, a first conductivity type emitter layer produced on the base layer, a contact layer comprising an undoped semiconductor layer produced on the emitter region, a second conductivity type first implantation regions produced at regions each consisting of the contact layer, the emitter layer, and the base layer, so as to leave a central region that is not part of the first implanation regions base electrodes produced on the first implantation regions, a first conductivity type second implantation region produced by implanting impurities from the surface of the contact layer extending into the emitter layer, at a region between the first implantation regions, and an emitter electrode produced on the second implantation region. Or, the emitter layer comprises undoped semiconductor layer and the implantation for producing the second implantation region is conducted so as to extend into the base layer. Accordingly, reduction in the emitter size and reduction in the emitter base homojunction capacitance are realized, thereby resulting in a superior characteristics and an advantage in circuit integration.

What is claimed is:

1. A method of producing a semiconductor device comprising:
   successively depositing a collector layer comprising a first conductivity type semi-conductor layer, a base layer comprising a second conductivity type semiconductor layer, an emitter layer comprising a first conductivity type semiconductor layer, and a contact layer comprising an undoped semiconductor layer on a sub-collector layer comprising a first conductivity type semi-conductor layer;
   depositing a resist pattern on said contact layer which becomes a mash for a first ion implantation region;
   ion implanting second conductivity type impurity ions from the surface of said contact layer through said contact and emitter layers and into said base layer using said resist pattern as a mask to produce a second conductivity type first implanation region;
   depositing first insulating films on the surfaces of said second conductivity type first implantation regions;
   removing said resist pattern and depositing a second insulating material on said first insulating films and the area from which the resist pattern was removed;
   etching said second insulating material to leave walls of said second material in the area from which the resist pattern was removed adjacent said first insulating films; and
   ion implanting first conductivity type impurity ions from the surface of said contact layer through said contact and emitter layers and into said emitter layer to produce a first conductivity type second implanation region.

2. The method of claim 1 including implanting ions selected from the group consisting essentially of Be+, Mg+, Zn+, and C+ as said first conductivity type impurity ions.

3. The method of claim 1 including implanting ions selected from the group consisting essentially of Si+, Se+, and S+ as said second conductivity type impurity ions.

4. A method of producing a semiconductor device comprising:
   successively depositing a collector layer comprising a first conductivity type semi-conductor layer, a base layer comprising a second conductivity type semiconductor layer, an emitter layer comprising an undoped semiconductor layer, and a contact layer comprising an undoped semiconductor layer on a sub-collector layer comprising a first conductivity type semiconductor layer;
   depositing a resist pattern on said contact layer which becomes a mask for a first ion implantation region;
   ion implanting second conductivity type impurity ions from the surface of said contact layer through said contact and emitter layers and into said base layer using said resist pattern as a mask to produce a second conductivity type first implantation region;
   depositing first insulating films on the surfaces of said second conductivity type first implantation regions;
   removing said resist pattern and depositing a second insulating material on said first insulating films and the area from which the resist pattern was removed;
   etching said second insulating material to leave walls of said second material in the area from which the resist pattern was removed adjacent said first insulating films; and
   ion implanting first conductivity type impurity ions from the surface of said contact layer through said contact and emitter layers and into said base layer to produce a first conductivity type second implantation region.

5. The method of claim 4 including implanting ions selected from the group consisting essentially of Be+, Mg+, Zn+, and C+ as said first conductivity type impurity ions.

6. The method of claim 4 including implanting ions selected from the group consisting essentially of Si+, Se+, and S+ as said second conductivity type impurity ions.

* * * * *